US005438293A

United States Patent [19]

Guerrieri et al.

[11] Patent Number: 5,438,293

[45] Date of Patent: Aug. 1, 1995

[54] LOW POWER ANALOG ABSOLUTE DIFFERENCING CIRCUIT AND ARCHITECTURE

[75] Inventors: Roberto Guerrieri, Bologna, Italy; Alan Kramer, Berkeley, Calif.

[73] Assignee: Regents of the University of California, Berkeley, Calif.

[21] Appl. No.: 132,447

[22] Filed: Oct. 4, 1993

[51] Int. Cl.[6] .............................................. H03K 19/00

[52] U.S. Cl. ...................................... 327/355; 395/21; 395/24; 327/361

[58] Field of Search ............... 307/201, 246, 355, 494, 307/529; 328/158; 364/829, 830, 862; 395/21, 24, 27; 327/63, 64, 355, 359, 361

[56] References Cited

U.S. PATENT DOCUMENTS

| | | | |
|---|---|---|---|
| 4,873,661 | 10/1989 | Tsivdis | 307/201 |
| 4,962,342 | 10/1990 | Mead et al. | 307/201 |
| 4,999,525 | 3/1991 | Park et al. | 307/201 |
| 5,049,758 | 9/1991 | Mead et al. | 307/246 |
| 5,053,638 | 10/1991 | Furutani et al. | 307/201 |
| 5,059,814 | 10/1991 | Mead et al. | 307/201 |
| 5,075,889 | 12/1991 | Jousselin et al. | 365/73 |
| 5,097,141 | 3/1992 | Leivian et al. | 307/201 |
| 5,237,210 | 8/1993 | Castro | 307/201 |
| 5,264,734 | 11/1993 | Holler et al. | 307/201 |
| 5,329,610 | 7/1994 | Castro | 395/24 |

*Primary Examiner*—Timothy P. Callahan
*Assistant Examiner*—Jeffrey Zweizig
*Attorney, Agent, or Firm*—Flehr, Hohbach, Test, Albritton & Herbert

[57] ABSTRACT

A low power analog absolute differencing circuit includes an integrating amplifier with an input node connected to a common integration line. The common integration line is connected to a set of analog comparison circuits to form an analog vector absolute differencing circuit row. Each of the analog comparison circuits compares a first analog signal to a second analog signal to produce an absolute difference signal. The absolute difference signal from each analog comparison circuit is transmitted in the form of charge drawn from the common integration line. The integrating amplifier provides an integration sum corresponding to the sum of the absolute difference signals. The analog absolute differencing architecture includes a set of analog vector absolute differencing circuit rows arranged to form an analog absolute difference computing array. The analog absolute difference computing array is loaded with a data block input array and a data frame input array. The data block input array inputs a first set of analog signals corresponding to a first set of data. The data frame input array inputs a second set of analog signals corresponding to a second set of data. The integrating amplifiers of the analog vector absolute differencing circuit rows of the analog absolute difference computing array constitute a distance integration array. A distance evaluation block takes as input the set of distances computed by the distance integration array and evaluates these distances to provide a single output, usually an address of a single row of the distance integration array.

11 Claims, 10 Drawing Sheets

LOW POWER ANALOG ABSOLUTE DIFFERENCING CIRCUIT AND ARCHITECTURE

This invention was made with the support of the U.S. Government under Grant (Contract) No. F49620-90-C0029 awarded by the Joint Services Electronics Program. The U.S. Government has certain rights to this invention.

BRIEF DESCRIPTION OF THE INVENTION

This invention relates generally to a circuit for comparing analog signals. More particularly, this invention relates to a low power analog circuit and related architecture for computing a Manhattan distance between input vector signals commonly utilized in such applications as signal processing and pattern recognition.

BACKGROUND OF THE INVENTION

The computation of the Manhattan distance between vectors, defined as $$\sum_{i=1}^{N} |X_i - Y_i|$$

where N is the number of dimensions of the vector, is a common operation in different fields, ranging from signal processing to pattern recognition. When this function is embedded in portable systems it is highly desirable to reduce the power consumption associated with the computation. Most portable systems are digital in nature. Consequently, the calculation of the Manhattan distance in a given application is computed digitally. It is difficult to optimize the digital calculation of a Manhattan distance to reduce power consumption.

OBJECTS AND SUMMARY OF THE INVENTION

It is a general object of the present invention to provide a low power analog circuit and related architecture for computing the Manhattan distance between vectors.

It is another object of the invention to provide a low power analog absolute differencing circuit that may be embedded in a digital environment.

It is another object of the invention to provide a low power analog circuit and related architecture that is readily adaptable to such applications as video processing, correlation computations, vector quantization, and neural networks.

These and other objects are achieved by a low power analog absolute differencing circuit and architecture in accordance with the invention. The circuit includes an integrating amplifier with an input node connected to a common integration line. The common integration line is connected to a set of analog comparison circuits to form an analog vector absolute differencing circuit row. Each of the analog comparison circuits compares a first analog signal to a second analog signal to produce an absolute difference signal. The absolute difference signal from each analog comparison circuit is transmitted in the form of charge drawn from the common integration line. The integrating amplifier provides an integration sum corresponding to the sum of the absolute difference signals. The analog absolute differencing architecture includes a set of analog vector absolute differencing circuit rows arranged to form an analog absolute difference computing array. The analog absolute difference computing array is loaded with a data block input array and a data frame input array. The data block input array inputs a first set of analog signals corresponding to a first set of data. The data frame input array inputs a second set of analog signals corresponding to a second set of data. The integrating amplifiers of the analog vector absolute differencing circuit rows of the analog absolute difference computing array constitute a distance integration array. A distance evaluation block takes as input the set of distances computed by the distance integration array and evaluates these distances to provide a single output, usually an address of a single row of the distance integration array.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
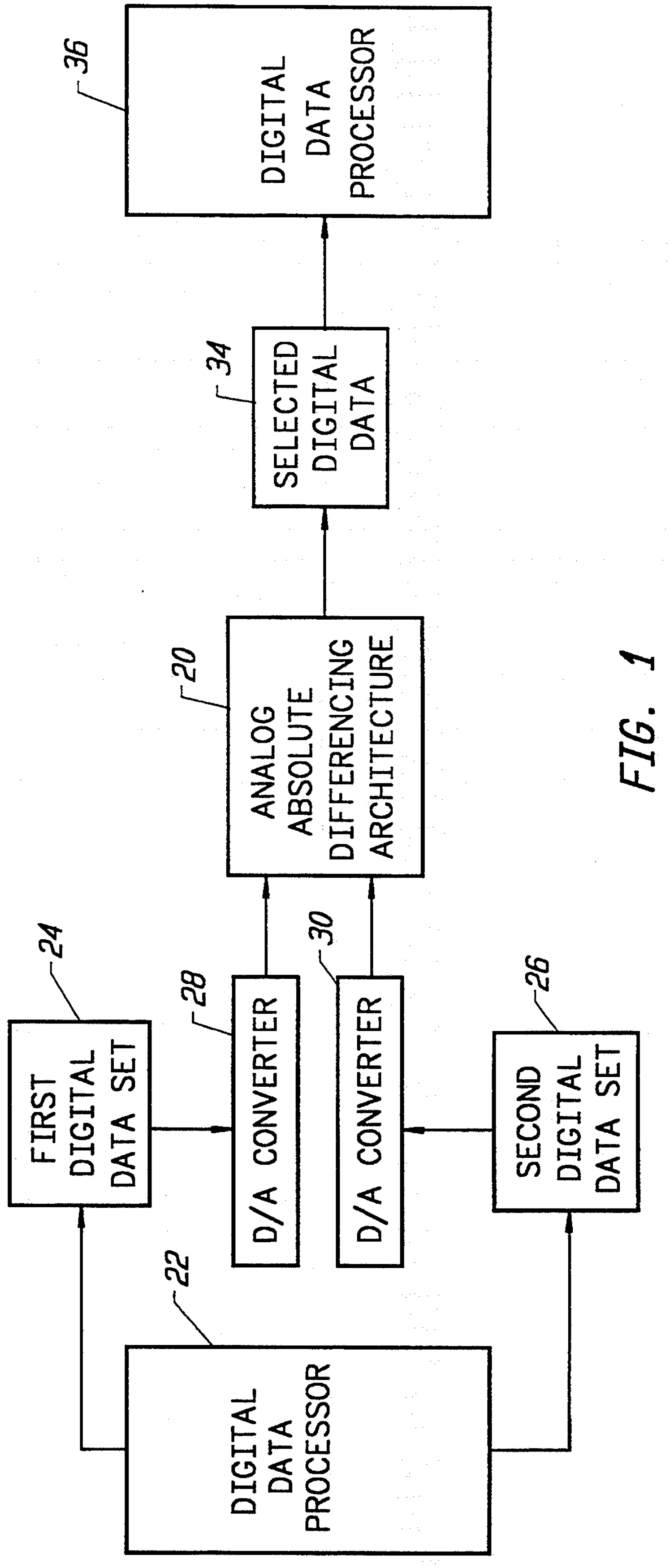
FIG. 1 depicts the analog absolute differencing architecture of the invention embedded in a digital data processing environment.

FIG. 1 depicts the analog absolute differencing architecture 20 of the invention embedded in a digital environment. A digital data processor 22 generates a first set of digital data 24 and a second set of digital data 26. The respective digital data sets 24, 26 are conveyed to digital-to-analog converters 28, 30. The analog output values from the digital-to-analog converters are processed by the analog absolute differencing architecture 20 of the invention, as will be described below. The analog absolute differencing architecture yields selected digital data 34 that is processed by a second digital data processor 36. The foregoing elements are preferably embedded in a single integrated circuit. However, it should be appreciated that the elements may be discretely formed. It will be appreciated by those skilled in the art that the analog absolute differencing architecture of the invention may be utilized in a completely analog environment. Nevertheless, the invention will be presently disclosed in relation to a digital environment. Specifically, the invention will initially be disclosed in relation to a digital video data processing environment.

Many video applications utilize data compression. More particularly, many video applications utilize transform code compressed domain formats (referred to herein as "transform domain" formats), which include the Discrete Cosine Transform (DCT) format, the interframe predictive code format, such as the Motion Compensation (MC) algorithm, which may be used in conjunction with the DCT format, and hybrid compressed formats. The DCT format is used in the compression standard for still images JPEG (Standard Draft, JPEG-9-R7, February 1991). The combination of Motion Compensation and Discrete Cosine Transform compression algorithm (MC/DCT) is used in a number of standards including: the compression standard for motion pictures (MPEG—standard Draft, MPEG Video Committee Draft, MPEG 90/176 Rev. 2, December 1990), the standard for video conferencing (CCITT—Recommendation H.261, Video Codec for Audiovisual Services at px64 kbits/s), and some High Definition Television proposals.

The MC/DCT algorithm exploits the temporal redundancy in a video sequence to reduce the amount of data that must be transmitted from one location to another. Instead of transmitting all video data for each new video frame, the motion compensation algorithm only requires that a video transmitter send motion vector data and error prediction data.

The MC algorithm requires a search over a fixed-size area, called the motion area, and identifies the optimal reference block in a previous video frame which may be used to construct an image for a block within a present video frame. In other words, a reference block in a previous video frame will be identified for use in a present video frame because of the redundancy in the two images. A prediction error, which is transmitted under the MC algorithm, defines the difference in image content between the reference block and the current block.

Figure 2A:
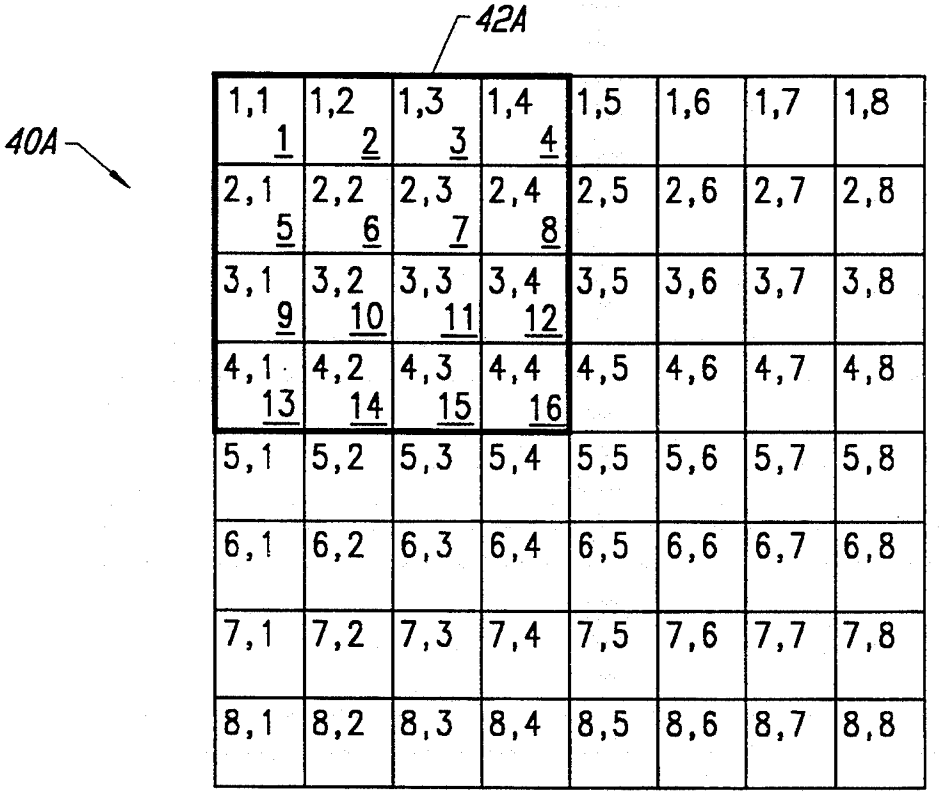
FIGS. 2A and 2B depict a data frame and a data block representing a sub-set of the data frame, the data frame is used to demonstrate the operation of the invention in a video processing context.

FIG. 2A depicts a data frame 40A. The data frame 40A may be viewed as a previous video frame which is used to construct an image block for a present video frame. In this simplified example, the video frame is an $8\times8$ matrix. FIG. 2A also depicts a $4\times4$ matrix representing a data block 42A. In this example, the data block 42A may be viewed as a match block including a portion of a present video frame. The match block of the present video frame is compared with the previous video frame, the entire video frame or a segment thereof, to identify a reference block in the previous video frame that may be used to generate the transmitted prediction error.

Figure 2B:
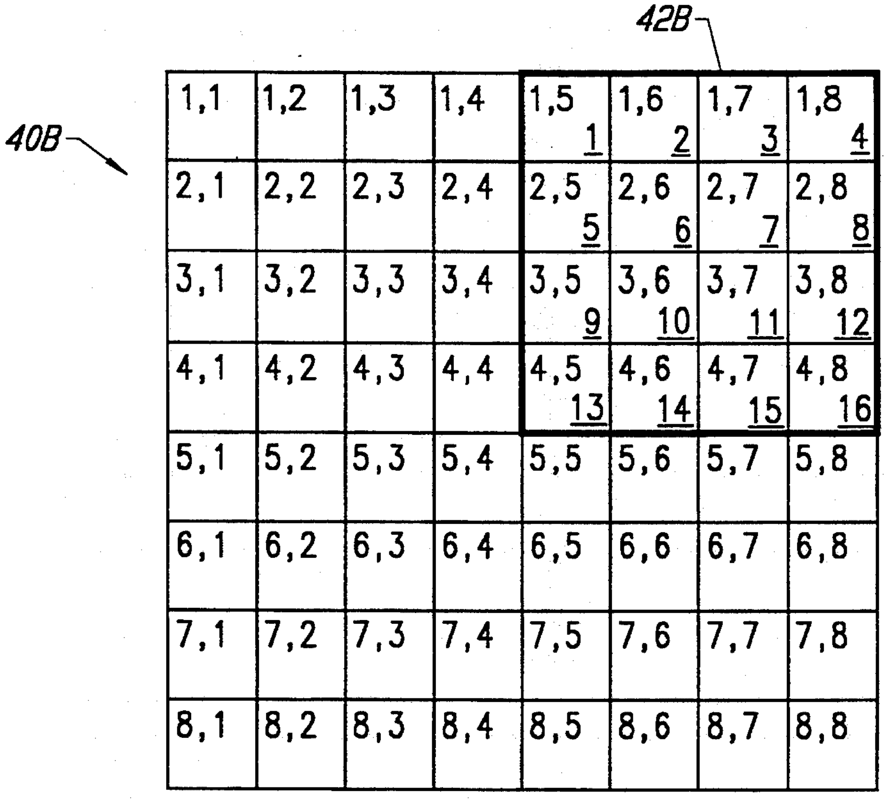

FIG. 2B depicts data block 42B transposed four columns to the right of the original position of data block 42A. By way of example, the position of data block 42B is deemed to be the selected reference block. In the MC/DCT format, the motion vector defines the difference between the position of the data block in the present frame and the position of the reference block in the previous frame. As previously indicated, in accordance with the MC/DCT format, the motion vector is then transmitted, along with the prediction error, in lieu of transmitting all of the video data associated with a video frame.

Thus, it will be appreciated that an important aspect of the MC/DCT algorithm is the identification of a reference block. The process of identifying a reference block can be viewed as a process of determining the smallest total absolute difference between values in a segment of a data frame and values in a corresponding data block. For example, returning to FIG. 2A, the value of data frame element (1,1) of data frame 40A is a pixel value of a previous video frame that is compared to a pixel value of a present video frame, namely pixel value 1 of data block 42A. Similarly, data frame element (1,2) is compared to data block element Z, and so on. The total absolute difference between the corresponding values of the data frame and the data block represent an indication of the difference between the two image segments. The smaller the total absolute difference, the closer the images are to one another.

The present invention provides a novel circuit for comparing two analog values. Used in relation with the foregoing example, the analog absolute differencing circuit of the invention compares two pixel values, one from a data frame and one from a data block. In addition, the present invention provides a novel circuit for adding a set of compared analog values. Finally, the invention provides an architecture for utilizing the described circuits.

Returning now to FIG. 1, a concrete example of the use of the present invention can be demonstrated. The digital processor 22 may be viewed as generating a first set of digital data 24 equivalent to a data block 42 and a second set of digital data 26 equivalent to a data frame 40. After digital-to-analog converters 28, 30 convert the respective signals to analog values, the analog absolute differencing architecture of the invention identifies the block of values within the data frame 40 which are closest to the data block 42. This block of data represents the reference block utilized in the MC/DCT algorithm. The digital row address corresponding to the reference block is the selected digital data 34 which is then processed by digital data processor 36. In this example, the digital data processor 36 would utilize the reference block to generate a prediction error and motion vector for transmission and subsequent processing at a remote venue.

Figure 3:
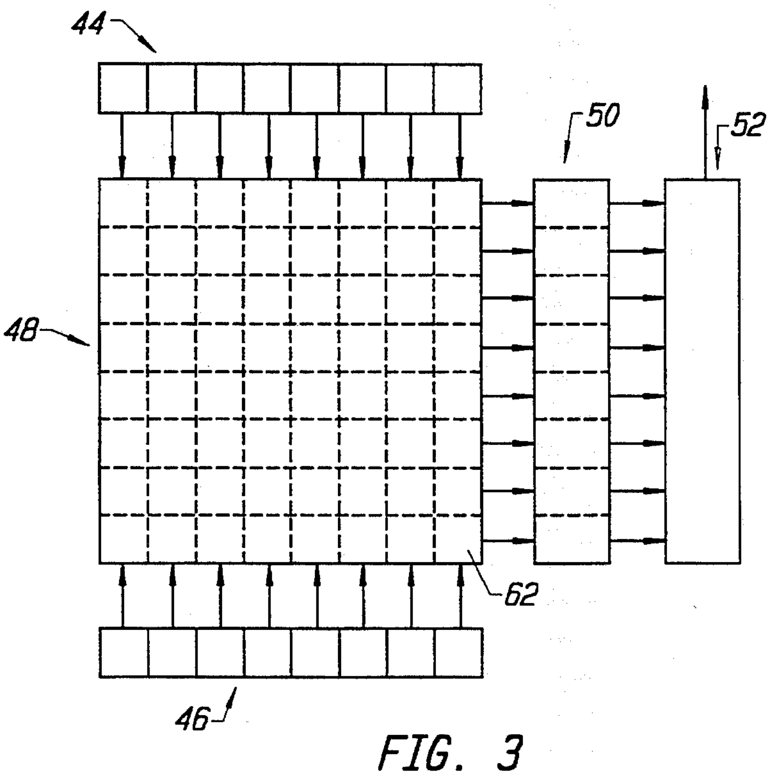
FIG. 3 symbolically depicts the analog absolute differencing architecture of the invention.

Now that a top-level functional application of the invention has been described, attention turns to implementation details associated with the invention. FIG. 3 symbolically depicts the analog absolute differencing architecture 20 of the invention. The analog absolute differencing architecture of the invention includes a data block input array 44 for loading data block values. The architecture 30 also includes a data frame input array 46 for loading data frame values. The data block values and the data frame values are respectively conveyed to an analog absolute difference computing array 48, which includes a matrix of analog absolute differencing circuits 62. Each analog absolute differencing circuit 62 compares two analog signal values to produce an analog absolute difference signal. The analog absolute difference computing array 48 is coupled to a distance integration array 50 that sums a row of analog absolute difference signals. Finally, the architecture 20 includes a distance evaluation block 52, which selects and outputs the digital address of the row with the lowest sum of analog absolute difference values, corresponding to the data frame position with the best match to the input pixel data (the reference block).

Figure 4:
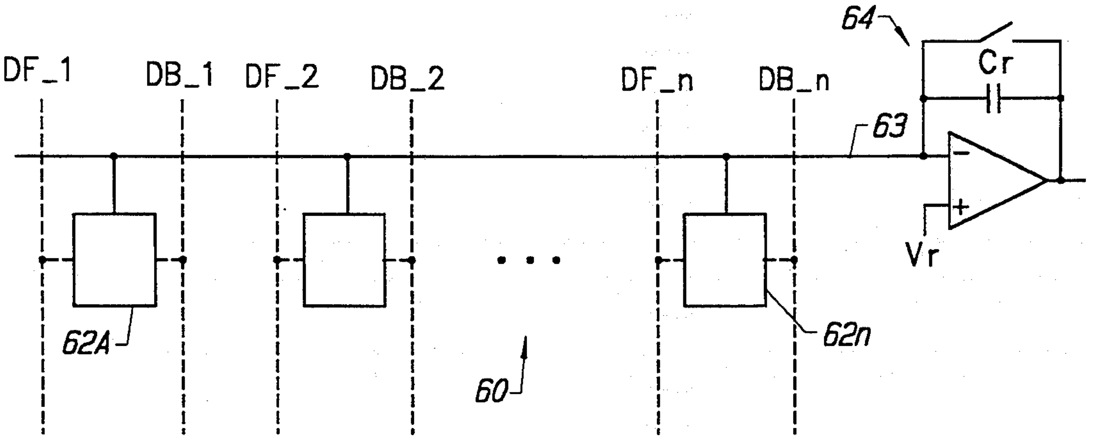
FIG. 4 is a simplified representation of an analog absolute differencing row forming a portion of the analog absolute differencing architecture of the invention.

Turning now to FIG. 4, the analog vector absolute differencing circuit 60 of the invention is depicted. The analog vector absolute differencing circuit 60 includes a plurality of analog absolute differencing circuits 62, which will be described below. Analog absolute differencing circuit 62A has two inputs DF_1 and DB_1. By way of example, the input value DF_1 corresponds to data frame position (1,1) in FIG. 2A and the input value DB_1 corresponds to the data block value 1 in FIG. 2A. The input value DF_N corresponds to data frame position (4,4) in FIG. 2A and the input value DB_N corresponds to the data block value 16 in FIG. 2A. Note that each analog absolute differencing circuit 62 is coupled to a common integration line 63. Distance integration circuit 64 sums the charge values of the analog absolute differencing circuits 62 on common integration line 63, as will be described in relation to FIG. 5.

Figure 5:
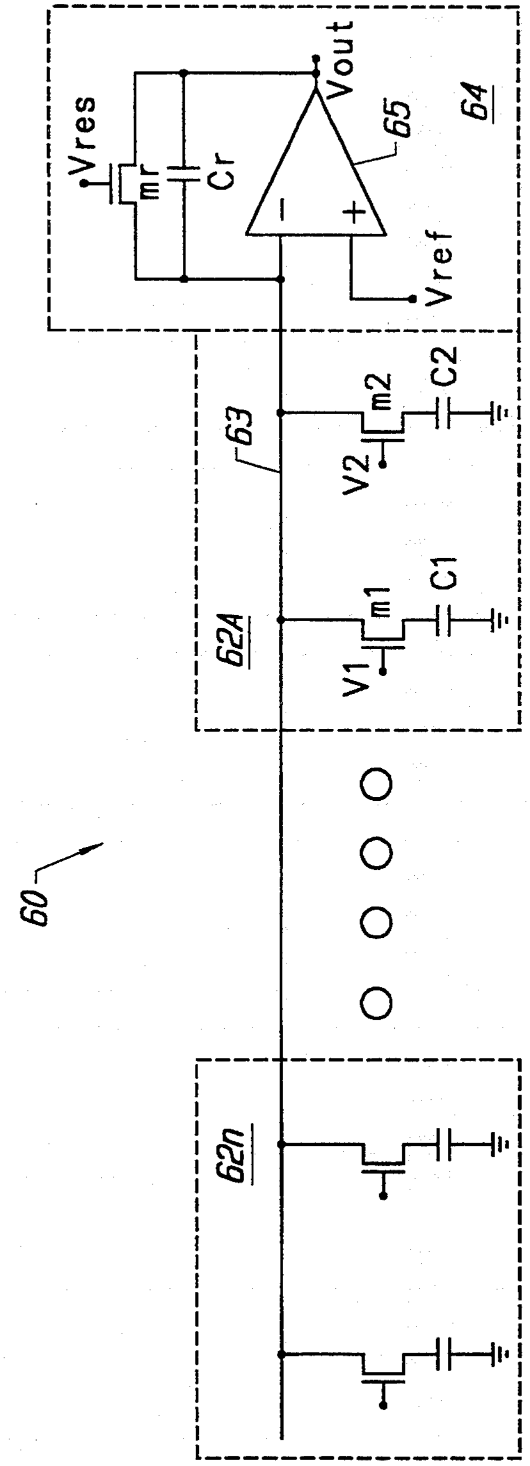
FIG. 5 is a representation of an analog absolute differencing row including a plurality of analog absolute differencing circuits coupled by a common integration line.

The analog absolute differencing circuit 62 and the distance integration circuit 64 of the invention will be described in relation to FIG. 5. Initially assume that all capacitors in the circuit are discharged and that gate voltages V1 and V2 are zero, keeping transistors ml and m2 off. The invention utilizes a precharge and compute phase. In the precharge phase, a voltage Vres is applied to the gate of transistor mr, turning the transistor on. Simultaneously, a voltage Vref, which is greater than a threshold voltage below the largest possible input voltage on V1 or V2 (i.e., Vref>Vmax−Vt), is applied to the positive input of operational amplifier 65. The feedback loop provided through transistor mr forces the voltage output and the common integration line 63 to go to a Vref value. A first input value, say DF_1, is then applied to V1 and a second input value, say DB_1, is applied to V2. Because Vref is greater than both V1−Vt and V2−Vt, the applied voltages turn both of the transistors on and allow charge to flow into capacitors C1 and C2. As this charge flows the voltages stored on the capacitors increase until they reach a value one threshold voltage below the gate voltage of the corresponding transistor, at which point each of the transistors ml and m2 reaches cutoff and turns off. That is, capacitor C1 is precharged to a voltage value of V1−Vt_m1 and capacitor C2 is precharged to a voltage of V2−Vt_m2. Charging of capacitors C1 and C2 terminates the precharge phase. Note that analogous capacitors within adjacent analog absolute differencing circuits 62B–62N will also precharge to appropriate voltages during the precharge phase.

In the compute stage, transistor mr is shut off. Thereafter, the inputs to V1 and V2 are reversed. That is, DF_1 is applied to V2 and DB_1 is applied to V1. Assume that DB_1>DF_1. In this case, the voltage at the gate of transistor m2 is smaller than before, thus, the transistor remains off and no additional charge flows onto capacitor C2. On the other hand, the voltage at the gate of transistor ml is larger than before, thereby turning transistor ml on and allowing additional charge to flow onto capacitor C1. As this charge flows, the voltage stored on C1 increases until it reaches a value of V1−Vt, at which point transistor ml again reaches cutoff and turns off, preventing further charge flow onto capacitor C1. During this transient, there is charge flow from Cr to C1 proportional to V1−V2. In the case where DB_1<=DF_1, the same argument shows a net charge flow from Cr to C2 proportional to V2−V1. Thus, in all cases, the combined charge flowing from Cr to C1 and C2 is proportional to |V1−V2|, and the analog absolute differencing circuit 60 provides a mean absolute difference for the two analog signals (DB_1, DB_2). The absolute difference is represented as a charge flow out of capacitor Cr.

All charges to the analog absolute differencing circuits 62 are conveyed through common integration line 63 from capacitor Cr. The combination of operational amplifier 65 and capacitor Cr serve as a commonly known integrator, wherein the output voltage (Vout) is a function of the charge stored on capacitor Cr, which is equal to the integrated charge drawn by the input line 63.

Note that the same transistor (m1 in the previous example) is used for both precharge and compute phases. As a result the spread in threshold voltage is intrinsically compensated, allowing the use of minimum size transistors. Since the information is conveyed by charge, the same reasoning holds true if the number of analog absolute differencing circuits 62 working in parallel is increased, with capacitor Cr providing the summation of the charge flows. Thus, the global function of the analog vector absolute differencing circuit 60 is to provide the mean absolute difference of two analog voltage vector signals.

Figure 6:
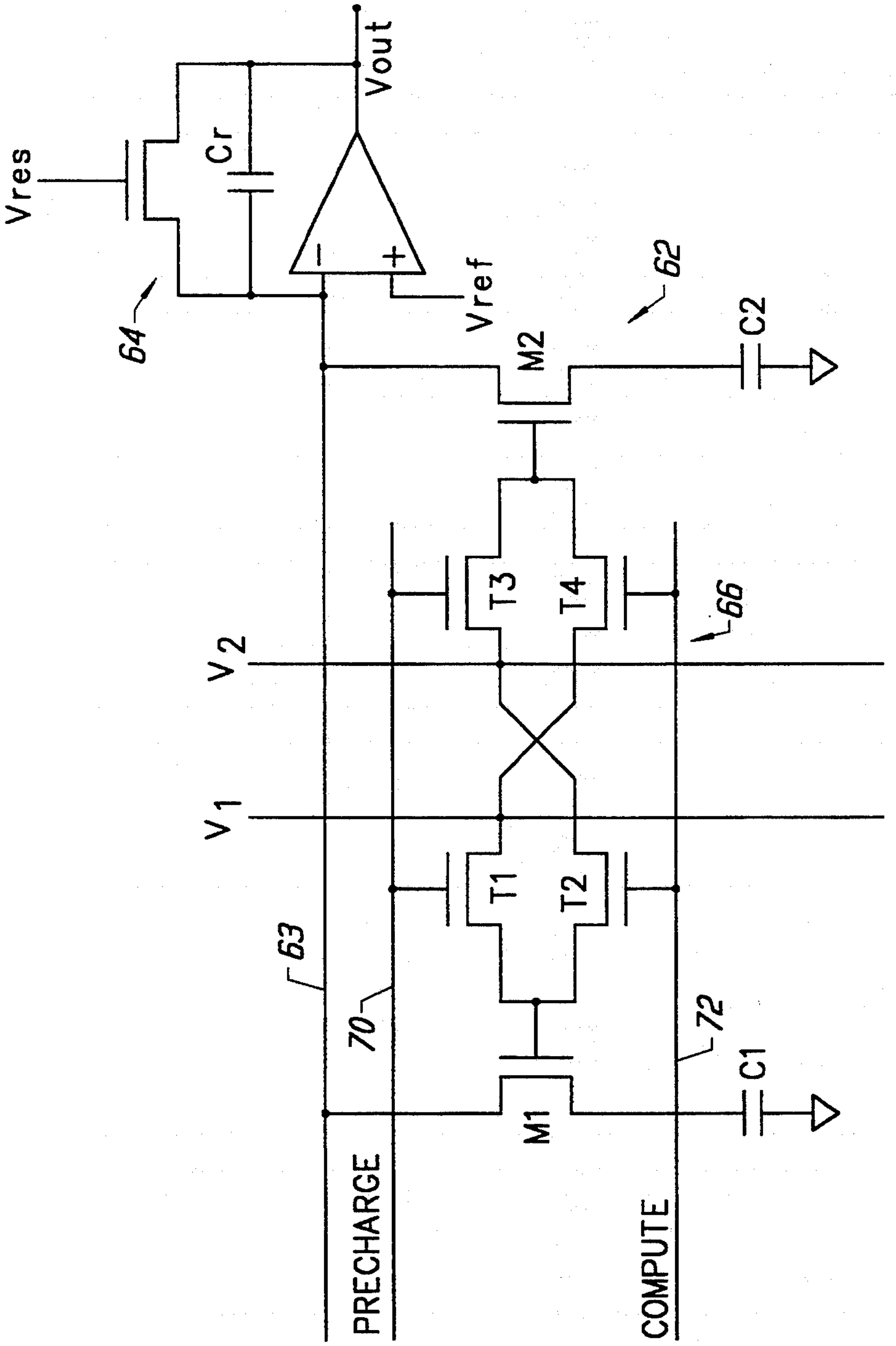
FIG. 6 depicts the analog absolute differencing circuit of the invention with a loading circuit.

FIG. 6 depicts a loading circuit 66 which may be employed within the analog absolute differencing circuit 62 of the invention. The loading circuit 66 serves to apply each analog input value to each absolute differencing transistor (m1, m2) of the analog absolute differencing circuit 62. More particularly, the loading circuit 66 applies the two analog input values to the two absolute differencing transistors during the precharge phase, and then applies the opposite analog input values to the two absolute differencing transistors during the compute phase.

A high signal on the precharge line 70 during the precharge phase will turn transistors T1 and T3 on. This will cause the voltage on V1 to be applied to the gate of ml and the voltage on V2 to be applied to the gate of M2. During the compute phase, a high signal on the compute line 72 will turn transistors T2 and T4 on. This will cause the voltage on V1 to be applied to the gate of m2 and the voltage on V2 to be applied to the gate of m1.

The precharge and compute phases associated with the absolute differencing of two analog signals is repeated for a sequence of signals. As previously discussed, the capacitor Cr is discharged during the precharge step. The capacitors C1 and C2 should be discharged prior to the precharge step. This may be accomplished by any of several techniques known in the art. For example, one may raise the gate inputs of transistors m1 and m2 to a high value (greater than Vt) to turn them on. A low reset voltage value may then be applied to the common line 63. Afterwards, the gate inputs of transistors m1 and m2 may be returned to a low value to shut them off before restoring the voltage on the common line to Vref.

Figure 7:
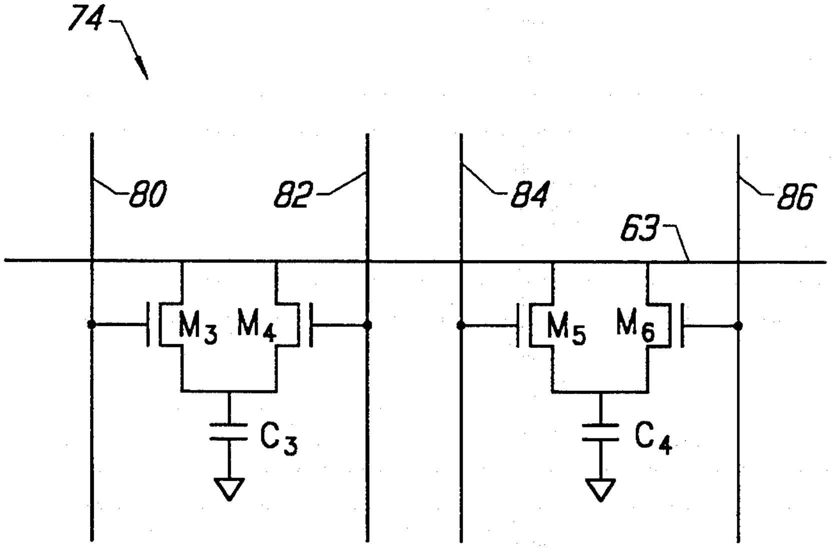
FIG. 7 is an alternate embodiment of an analog absolute differencing circuit that may be used in accordance with the invention.

FIG. 7 depicts an alternate embodiment of an analog absolute differencing circuit 74 that may be used in accordance with the analog vector absolute differencing circuit 60 of the invention. The circuit 74 includes a first voltage precharge input line 80 connected to the gate of transistor m3 and a first voltage compute input line 82 connected to the gate of transistor m4. The sources of transistors m3 and m4 are commonly coupled to capacitor C3. A second voltage precharge input line 84 is connected to the gate of transistor m4 and a second voltage compute input line 86 is connected to the gate of transistor m6. Common integration line 63 is coupled to the drains of each of the transistors m3, m4, m5, m6.

Relying upon the previous example, input values, say DF_1 and DB_1, are respectively applied to first voltage precharge input line 80 and second voltage precharge input line 84, causing transistors m3 and m5 to turn on (while m4 and m6 remain off) and respectively store charges on capacitors C3 and C4. Thereafter, the input values are applied to the compute inputs in a switched manner such that DF_1 and DB_1 are respectively applied to second voltage compute input line 86 and first voltage compute input line 82. As a result, m3 and m5 turn off and, once again assuming that DB_1>DF_1, transistor m6 remains off while transistor m4 turns on until the voltage on capacitor C3 is equivalent to the gate voltage of transistor m4 minus a threshold voltage. During this transient, there is a charge flow from Cr to C3 (or C4), over common integration line 63, proportional to |DB_1−DF_1|. The disadvantage of this approach is that any mismatch in the thresholds of a transistor pair, such as m3 and m4, may result in a reduction in the computational precision of the circuit.

One skilled in the art will appreciate that the loading circuits of FIG. 6 and 7 may also be implemented in a time-multiplexed manner. In such an embodiment, only half the depicted loading circuit is required (for example, line V1, capacitor C1 and transistors m1, T1, and T2 in FIG. 6; lines 80 and 82, capacitor C3, and transistors m3 and m4 in FIG. 7). Instead of calculating the two difference quantities (V1−V2 and V2−V1) simultaneously, the operations are performed sequentially on the same half circuit. This embodiment results in a smaller circuit. The circuit is also more accurate since a single capacitor is used for both difference calculations, thereby eliminating a source of error. The disadvantage with the technique is that it results in a more complicated timing scheme and the total time to perform a computation is increased.

The analog vector absolute differencing circuit 60 of the invention has now been fully described. Those skilled in the art will appreciate that minimal power dissipation is associated with its operation. Consequently, it is ideal for portable data processing applications. Attention presently turns to an analog computing architecture 20 that may be used to load values into the circuit.

Figure 8:
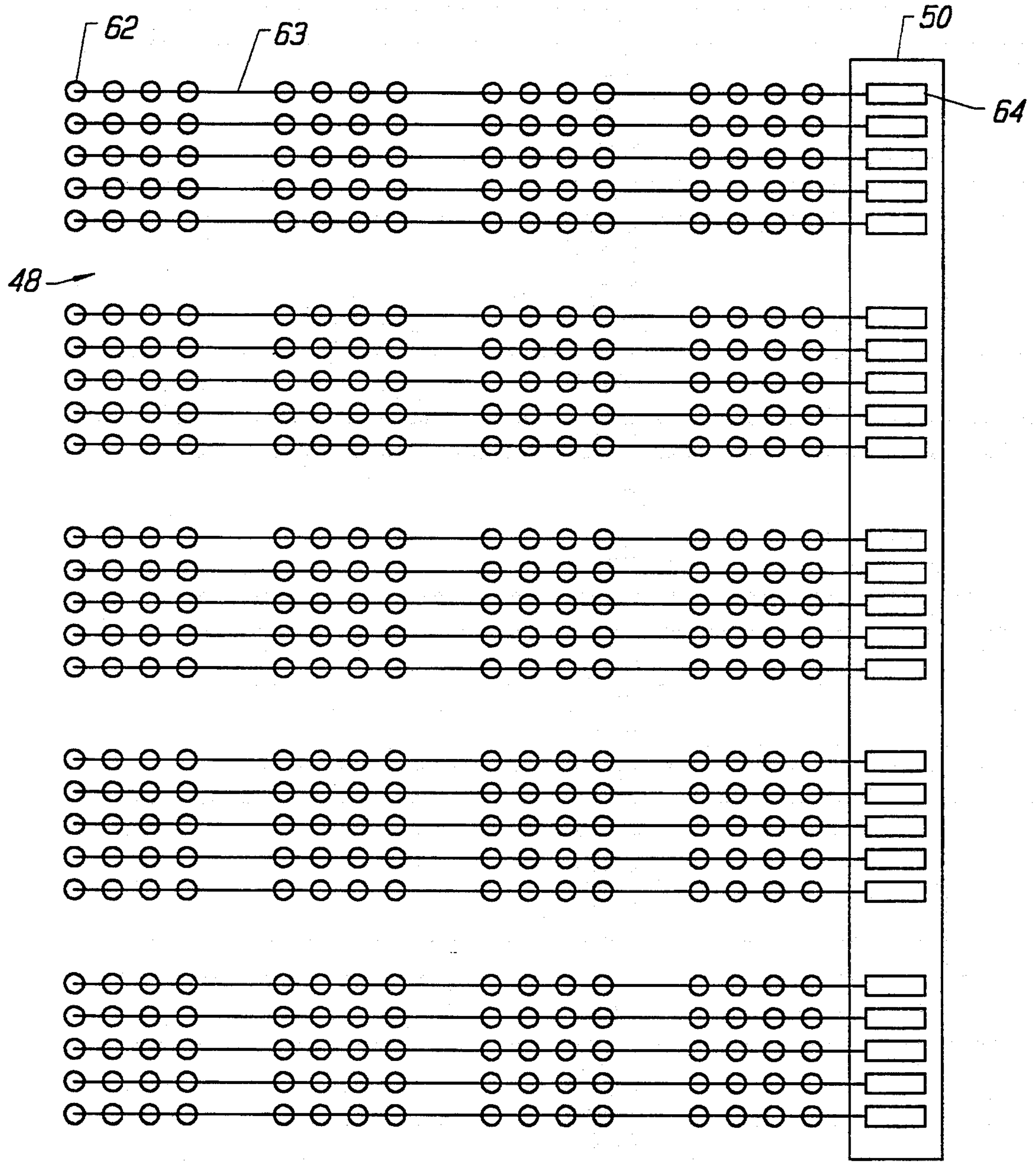
FIG. 8 is a simplified representation of the analog absolute difference computing array of the invention including a plurality of horizontal common integration lines coupled to corresponding distance integration circuits that form a distance integration array.

The signal processing example described in relation to FIGS. 2A and 2B included a data block with 16 blocks (N units per side, where N=4) and a data frame with 64 blocks (M=2N). Preferably, parallelism is exploited by presenting an entire data frame and data block to the analog absolute difference computing array 48 and computing all Manhattan distances in one cycle. To achieve this, an $N^2$ by $(N+1)^2$ array of analog absolute differencing circuits 62 is provided in the analog absolute difference computing array 48. In this scheme, each row of the array performs the computations between the data block (block to be matched) and a particular candidate block (segment of the entire data frame or video frame). FIG. 8 depicts an analog absolute difference computing array 48 in accordance with this scheme. The array 48 is a 16 ($4^2$) by 20 ($5^2$) matrix of analog absolute differencing circuits 62. Note that each absolute differencing circuit 62 in a row is connected to a common integration line 63, which has a distance integration circuit 64 at its end. The column of distance integration circuits 64 define a distance integration array 50.

The array 48 takes as input the $N^2$ pixel values of the data block (match block) and the $4N^2$ pixel values of the data frame (search window). Proper routing of these inputs to the $N^2 \times (N+1)^2$ computing elements in the array 48 is important to minimize array area. The $N^2$ pixel values in the match block can be routed to each of the N+1)$^2$ rows of $N^2$ computing elements with straight lines 90, one per column, as shown in FIG. 9.

Figure 10:
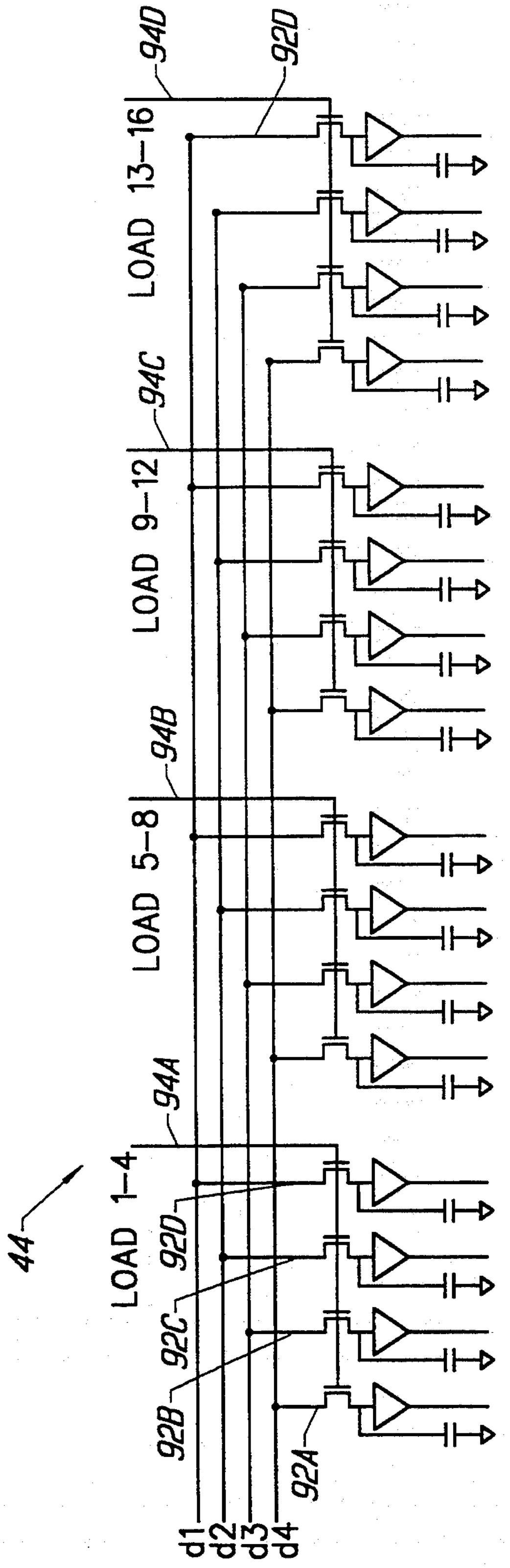
FIG. 10 is an input buffer array that may be used in accordance with the invention.

The data may be driven into the array by utilizing the data block input array 44 shown in FIG. 10. The N input lines (d1, d2, d3, d4) allow N values to be loaded per cycle. Pass transistors 92 are enabled by gate drive lines 94. For instance, during a first cycle, gate drive line 94A applies a voltage to the gates of transistors 92A–92D, allowing the signals on input lines (d1, d2, d3, d4) to be passed by the transistors 92–92D. It will be appreciated that the data block input array 44 is loaded in four cycles. The analog absolute difference computing array 48 is preferably provided with four data block input arrays 44, in which case all data for the array 48 may be loaded in 4 cycles.

Figure 9:
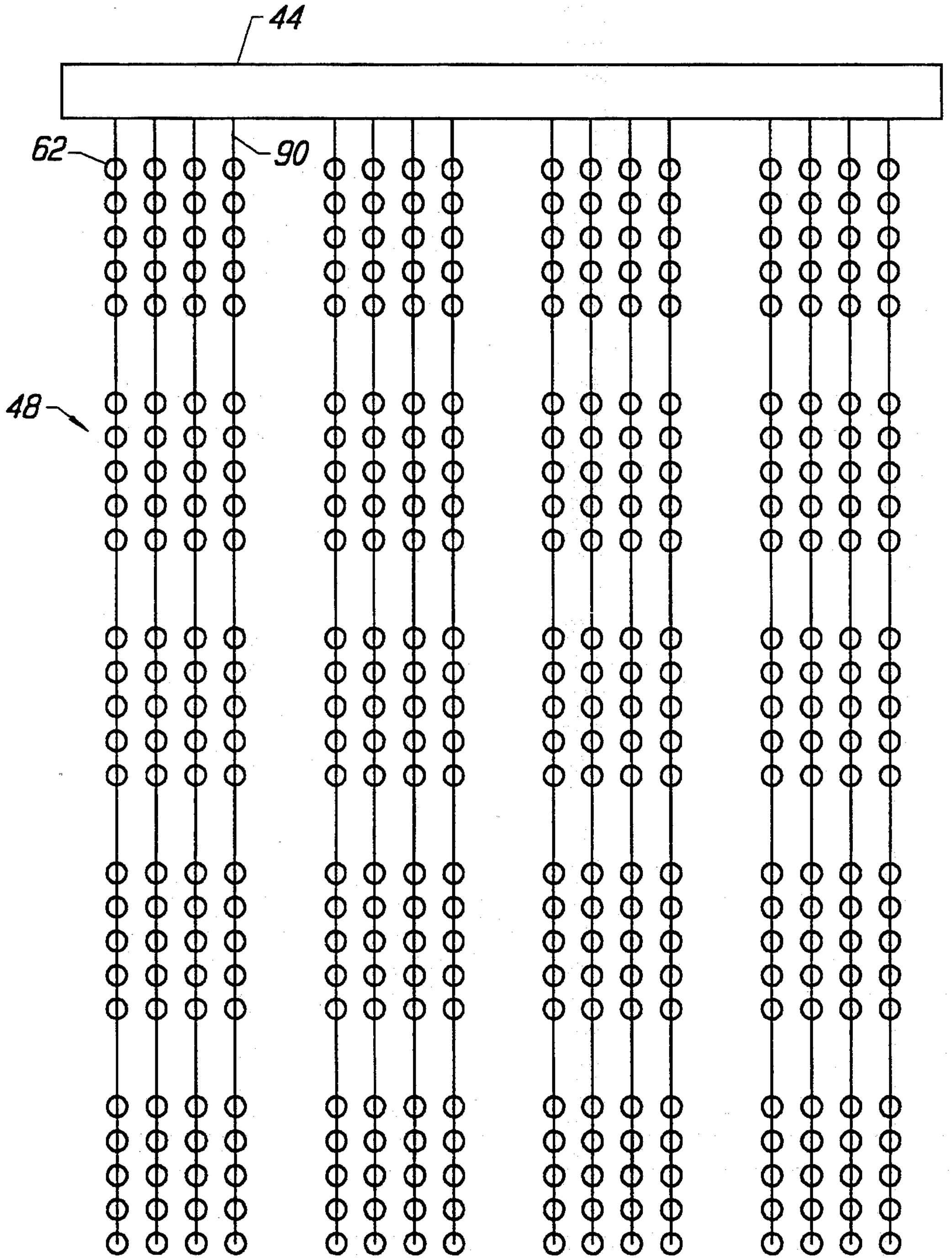
FIG. 9 is a simplified representation of the analog absolute difference computing array of the invention including a plurality of vertical load lines for loading data block values.

FIG. 9 depicts the scheme for loading the data block (match block) 42 to each row of the analog absolute difference computing array 48. Each row also requires data corresponding to a selected block of the data frame (search window) 40. For example, the first row of the array would receive the data block values (1 to 16) of block 42A of FIG. 2A. The same row would also receive the data frame values (1,1) to (1,4) to (4,1) to (4,4) of data frame 40A of FIG. 2A. The second row of the array would receive the same data block values (1 to 16) of block 42A of FIG. 2A. However, the second row would also receive data frame values shifted by one column, that is data frame values (1,2) to (1,5) to (4,2) to (4,5). This partitioning continues for each row of the array.

Figure 11:
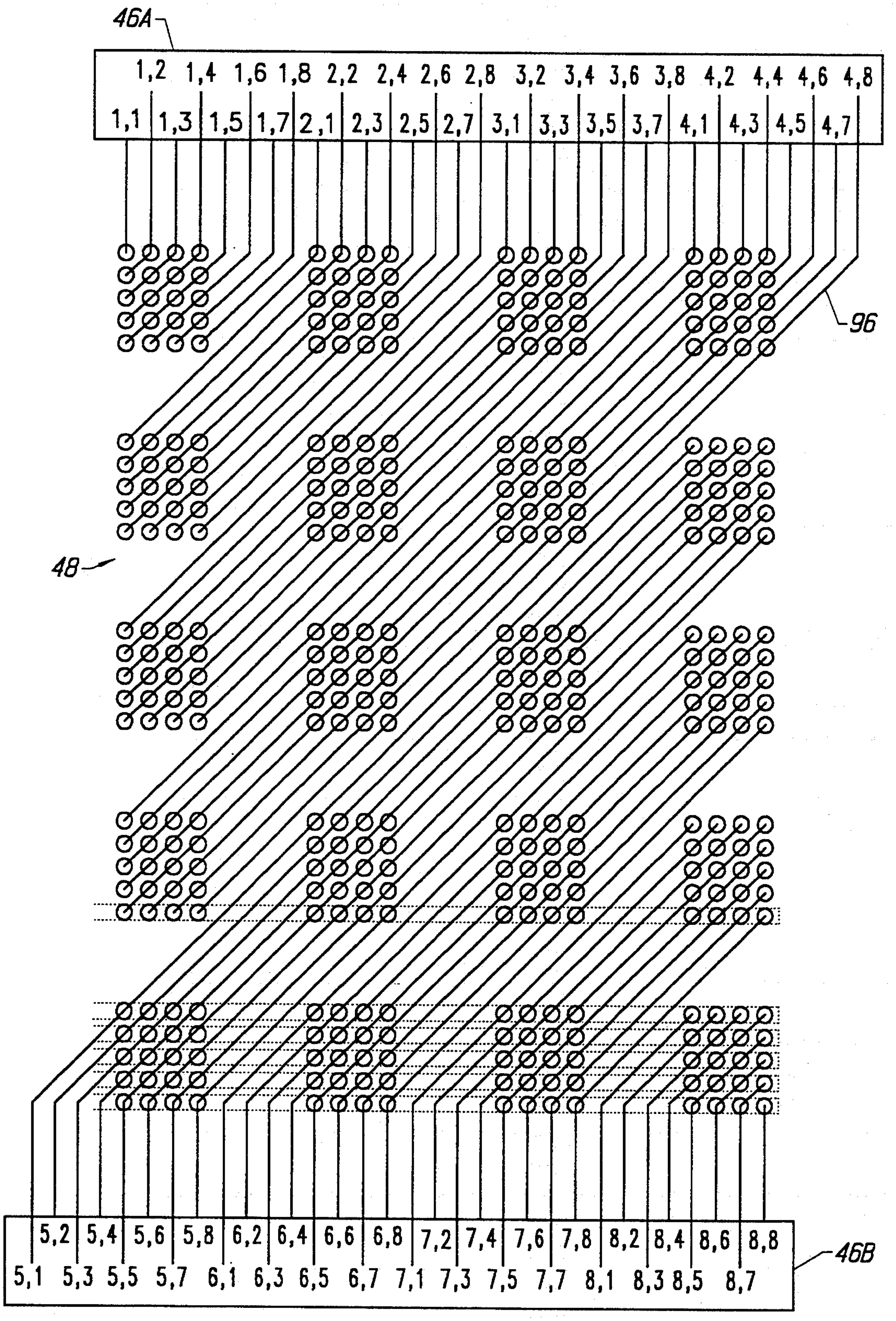
FIG. 11 is a simplified representation of the analog absolute difference computing array of the invention including a plurality of diagonal load lines for loading data frame values.

FIG. 11 depicts an efficient wiring scheme for loading data frame values into the analog absolute difference computing array 48. Note that the first row of the array receives the data frame values (1,1) to (1,4) to (4,1) to (4,4) of data frame 40A of FIG. 2A. The second row receives a data frame shifted by one column, that is data frame values (1,2) to (1,5) to (4,2) to (4,5). Note that the fifth row of the array receives the data frame shifted by four columns, as shown in 42B of FIG. 2B, namely values (1,5) to (1,8) to (4,5) to (4,8).

On an abstract level, the first (N+1) rows of the array correspond to the set of candidate blocks along the top of the data frame (search window), where row i is shifted i pixels to the right. Any of these rows with index i needs the same wires as the first row shifted i to the right.

The N+2 row of the array corresponds to the candidate block which is the leftmost block of the search window one pixel down from the top. These wires are the wires of the first row shifted by 2N. In general, the ith row of the array corresponding to the candidate block with its top left corner $Y=\text{int}((i-1)/(N+1))$ pixels down from the top and $X=\text{rem}((i-1)/(N+1))$ pixels to the right of the top left corner of the search window needs the same wires as the first row of the array shifted by 2NY+X.

The disclosed routing format for the analog absolute difference computing array is very efficient. The number of computing elements in the array is $N^2(N+1)^2=N^4+2N^3+N^2$. The area required for routing is $2(2N^2((N+1)^2+N(N-1))=8N^4+4N^3+4N^2$. Thus, other than a constant factor, there is no area overhead for routing beyond that needed to contain the computing elements.

The diagonal routing shown in FIG. 11 would typically be formed on a different interconnect layer (i.e., poly, metal_1, metal_2) than the vertical routing shown in FIG. 9. FIG. 11 shows data frame input array 46. Within the data frame input array are input pads corresponding to the block numbers shown in FIGS. 2A and 2B. It should be appreciated that the values loaded by the data frame input array 46 utilize the buffering structure of FIG. 10.

Returning now to FIG. 3, all elements of the analog absolute differencing architecture of the invention have been described except for the distance evaluation block 52. Possible evaluation functions performed by the distance evaluation block include identifying and outputting the address of the row with the smallest distance of the set (loser-take-all), identifying and outputting the address of the row with the greatest distance of the set (winner-take-all), or outputting a classification vector, where each class of the vector has a value which has been weighted by the distances of the rows corresponding to that class, usually with an inverse weighting. In the case of a loser-take-all scheme, the distance evaluation block 52 selects and outputs the digital address of the row with the lowest sum of analog absolute difference values within the distance integration array block. This value corresponds to the data frame position with the best match to the input pixel data. Evaluation functions are known in the art. U.S. Pat. Nos. 5,059,814 and 5,049,758 teach winner-take-all evaluation architectures that may be used in accordance with the invention. These two patents are incorporated by reference herein. To be used with the invention, the winner-take-all architectures would be slightly modified to perform a loser-take-all function. This change in functionality is readily achieved by simply inverting the input values to the winner-take-all circuit. Analogous simple modifications may also be relied upon.

As previously stated, the distance evaluation block 52 identifies the lowest value within the distance integration array 50. It can be appreciated from the discussion above that each row of the analog absolute difference computing array 48 and each corresponding row in the distance evaluation block corresponds to a block of values within the data frame 40. For instance, the first row corresponds to the data frame values (1,1) to (1,4) to (4,1) to (4,4) of data frame 40A of FIG. 2A, while the second row of the array corresponds to the data frame values (1,2) to (1,5) to (4,2) to (4,5).

The application of the analog vector absolute differencing circuit 60 of the invention to block matching for image compression has been described. Other applications of the circuit 60 include signal processing for correlation, vector quantization, and neural network computation.

Correlation computation is very similar to block matching except that it works on a one-dimensional signal such as sound, instead of a two dimensional signal such as an image. The idea is to "sweep" a short signal through a long signal to determine where the two signals correlate most closely. The overall architecture to execute this computation is very similar to that for block matching. The short signal is supplied to the distance integration array 50 through the data block input array 44, while the long signal is supplied through the data frame input array 46. The wiring may be simplified because the original input is 1-dimensional rather than 2-dimensional, thus there is no need for dummy rows and dummy columns to get the proper array spacing. In other words, a $4N^2 \times 4N^2$ array may be used and vertical leads on different interconnect layers may be used to load values.

An application for a one-dimensional signal correlation includes the Global Positioning System. In this application, an initial receiver location is determined by correlating a noisy incoming signal with the expected signal that would be received from all possible satellites in all possible locations.

Another application for the analog absolute differencing circuit of the invention is vector quantization. Vector quantization is a computation wherein a new, possibly noisy signal, is quantized into the closest of a set of predetermined possibilities. The analog absolute differencing architecture 20 to perform this computation is similar to the previous applications. However, in this application there is no relationship between the values of one row and the next. Therefore, instead of using a single set of diagonal wires 96 to provide all row values in parallel, for this application one must use some form of local memory to load each of the row vectors sequentially. In this scheme, a second set of vertical wires (as in FIG. 9) on a different metal layer may be used in lieu of the diagonal wires 96 of FIG. 11. The overall timing includes a sequential load phase where all row values are loaded into local memory, followed by a series of parallel precharge and compute phases, to identify a match block 42 within the data frame 40. Depending on the type of memory used and the exact computation being performed, precharge compute phases may be repeated until the local memory needs to be refreshed or loaded with different values. Applications that make use of vector quantization include error correction in digital communication, as well as classification tasks such as that of handwritten character recognition.

The analog absolute differencing architecture of the invention may also be used in neural network applications. In the most general neural network architecture, all outputs of one layer of the network are used as inputs to the next layer. With the present invention, it is possible to view the distance outputs of the distance integration array 50 as a one-dimensional analog-valued vector which could then be fed as the input vector to another array, and so on.

Most neural network architectures focus on the dot product between a local weight vector and a global input vector as the function being computed, but more and more make use of Manhattan distance, such as computed by the circuit of the present invention. Implementation details, such as the need for local memory versus the possibility of using a separate diagonal bus, depend strongly on the exact network computation being performed. Most networks contain no regularity between weight vectors and so, like the vector quantization architecture, would need local memory, but others, such as those making use of "weight sharing" demonstrate a great deal of regularity. Many of the large useful networks, such as those used for character recognition, make use of weight sharing to introduce regularity.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. An analog vector absolute differencing circuit comprising:

a linear array of comparison circuits, each of said comparison circuits of said linear array including means for comparing a first analog signal value to a second analog signal value to produce an absolute difference signal, said linear array thereby producing a plurality of absolute difference signals;

a common integration line coupled to said linear array of comparison circuits, said common integration line receiving said plurality of absolute difference signals;

means, coupled to said integration line, for summing said absolute difference signals to yield a difference sum; wherein said comparing means includes a first transistor, the source of said first transistor being coupled to a first capacitor, the drain of said first transistor being coupled to said common integration line, and the gate of said first transistor being coupled to a first analog signal input node, a second transistor, the source of said second transistor being coupled to a second capacitor, the drain of said second transistor being coupled to said common integration line, and the gate of said second transistor being coupled to a second analog signal input node, wherein a first analog signal is stored on said first capacitor corresponding to said first analog signal value and a second analog signal is stored on said second capacitor corresponding to said second analog signal value during a precharge step, and wherein said first analog signal value is applied to said second analog signal input node and said second analog signal value is applied to said first analog signal input node during a compute step to generate said absolute difference signal.

2. The analog vector absolute differencing circuit of claim 1 wherein said comparing means further comprises a loading circuit including a third transistor, the source of said third transistor being coupled to a first analog signal input line, the drain of said third transistor being coupled to said first analog signal input node, and the gate of said third transistor being coupled to a precharge enable line, a fourth transistor, the source of said fourth transistor being coupled to a second analog signal input line, the drain of said fourth transistor being coupled to said second analog signal input node, and the gate of said fourth transistor being coupled to said precharge enable line, a fifth transistor, the source of said fifth transistor being coupled to said second analog signal input line, the drain of said fifth transistor being coupled to said first analog signal input node, and the gate of said fifth transistor being coupled to a compute enable line, a sixth transistor, the source of said sixth transistor being coupled to said first analog signal input line, the drain of said sixth transistor being coupled to said second analog signal input node, and the gate of said sixth transistor being coupled to said compute enable line, wherein said precharge step is executed with a precharge enable signal applied to said precharge enable line, and said compute step is executed with a compute step enable signal applied to said compute enable line.

3. An analog vector absolute differencing circuit comprising:

a distance integration circuit including an operational amplifier with a capacitive feedback loop, said capacitive feedback loop being coupled to a first input node of said operational amplifier;

a common integration line coupled to said first input node of said operational amplifier; and a plurality of analog absolute differencing circuits coupled to said common integration line, each of said plurality of analog absolute differencing circuits including:

a first storage device for storing a first analog value corresponding to a first analog signal, a second storage device for storing a second analog value corresponding to a second analog signal, said second analog signal being smaller than said first analog signal, and a switching circuit for comparing said first analog signal to said second analog value so as to produce an absolute difference signal on said common integration line corresponding to the voltage difference between said first analog signal and said second analog signal, wherein said plurality of analog absolute differencing circuits generate a corresponding plurality of absolute difference signals on said common integration line and said distance integration circuit produces an output signal corresponding to the sum of said plurality of absolute difference signals, and wherein said first storage device is a first capacitor coupled to the source of a first transistor of said switching circuit and said second storage device is a second capacitor coupled to the source of a second transistor of said switching circuit.

4. The analog vector absolute differencing circuit of claim 3 wherein the drain of said first transistor is coupled to said common integration line and the gate of said first transistor is coupled to a first analog signal input node, and the drain of said second transistor is coupled to said common integration and the gate of said second transistor is coupled to a second analog signal input node.

5. The analog vector absolute differencing circuit of claim 4 wherein said switching circuit further comprises a loading circuit including a third transistor, the source of said third transistor being coupled to a first analog signal input line, the drain of said third transistor being coupled to said first analog signal input node, and the gate of said third transistor being coupled to a precharge enable line, a fourth transistor, the source of said fourth transistor being coupled to a second analog signal input line, the drain of said fourth transistor being coupled to said second analog signal input node, and the gate of said fourth transistor being coupled to said precharge enable line, a fifth transistor, the source of said fifth transistor being coupled to said second analog signal input line, the drain of said fifth transistor being coupled to said first analog signal input node, and the gate of said fifth transistor being coupled to a compute enable line, a sixth transistor, the source of said sixth transistor being coupled to said first analog signal input line, the drain of said sixth transistor being coupled to said second analog signal input node, and the gate of said sixth transistor being coupled to said compute enable line, wherein said precharge step is executed with a precharge enable signal applied to said precharge enable line, and said compute step is executed with a compute step enable signal applied to said compute enable line.

6. An analog vector absolute differencing circuit comprising:

a distance integration circuit including an operational amplifier with a capacitive feedback loop, said capacitive feedback loop being coupled to a first input node of said operational amplifier;

a common integration line coupled to said first input node of said operational amplifier; and a plurality of analog absolute differencing circuits coupled to said common integration line, each of said plurality of analog absolute differencing circuits including:

a first transistor, the source of said first transistor being coupled to a first capacitor, the drain of said first transistor being coupled to said common integration line, and the gate of said first transistor being coupled to a first analog signal input node, a second transistor, the source of said second transistor being coupled to a second capacitor, the drain of said second transistor being coupled to said common integration line, and the gate of said second transistor being coupled to a second analog signal input node, a loading circuit including a third transistor, the source of said third transistor being coupled to a first analog signal input line, the drain of said third transistor being coupled to said first analog signal input node, and the gate of said third transistor being coupled to a precharge enable line, a fourth transistor, the source of said fourth transistor being coupled to a second analog signal input line, the drain of said fourth transistor being coupled to said second analog signal input node, and the gate of said fourth transistor being coupled to said precharge enable line, a fifth transistor, the source of said fifth transistor being coupled to said second analog signal input line, the drain of said fifth transistor being coupled to said first analog signal input node, and the gate of said fifth transistor being coupled to a compute enable line, a sixth transistor, the source of said sixth transistor being coupled to said first analog signal input line, the drain of said sixth transistor being coupled to said second analog signal input node, and the gate of said sixth transistor being coupled to said compute enable line, wherein a first analog signal is loaded onto said first capacitor in response to a precharge enable signal on said precharge enable line and a second analog signal is loaded onto said second capacitor in response to said precharge enable signal on said precharge enable line, and wherein said first analog signal is applied to said second analog signal input node in response to a compute enable signal on said compute enable line and said second analog signal is applied to said first analog signal input node in response to said compute enable signal on said compute enable line.

7. The analog vector absolute differencing circuit of claim 6 wherein said distance integration circuit further includes a bypass transistor coupled in parallel to said capacitive feedback loop.

8. An analog vector absolute differencing circuit comprising:

a common integration line; and a linear array of comparison circuits connected to said common integration line, each of said comparison circuits including a first capacitor with a first node connected to ground and a second node, a first transistor, the source of said first transistor being coupled to said second node of said first capacitor, the drain of said first transistor being coupled to said common integration line, and the gate of said first transistor being coupled to a first analog signal input node, a second capacitor with a first node connected to ground and a second node, a second transistor, the source of said second transistor being coupled to said second node of said second capacitor, the drain of said second transistor being coupled to said common integration line, and the gate of said second transistor being coupled to a second analog signal input node, wherein a first analog signal is applied to said first analog signal input node during a precharge step to produce a first analog charge signal on said first capacitor, a second analog signal is applied to said second analog signal input node during said precharge step to produce a second analog charge signal on said second capacitor, said first analog signal is applied to said second analog signal input node during a compute step to produce a second difference analog signal on said second capacitor, and said second analog signal is applied to said second analog signal input node during said compute step to produce a first difference analog signal on said first capacitor, the larger of said first difference analog signal and said second difference analog signal forming an absolute difference signal that is applied to said common integration line.

9. The analog vector absolute differencing circuit of claim 8 further comprising a loading circuit including a third transistor, the source of said third transistor being coupled to a first analog signal input line, the drain of said third transistor being coupled to said first analog signal input node, and the gate of said third transistor being coupled to a precharge enable line, a fourth transistor, the source of said fourth transistor being coupled to a second analog signal input line, the drain of said fourth transistor being coupled to said second analog signal input node, and the gate of said fourth transistor being coupled to said precharge enable line, a fifth transistor, the source of said fifth transistor being coupled to said second analog signal input line, the drain of said fifth transistor being coupled to said first analog signal input node, and the gate of said fifth transistor being coupled to a compute enable line, a sixth transistor, the source of said sixth transistor being coupled to said first analog signal input line, the drain of said sixth transistor being coupled to said second analog signal input node, and the gate of said sixth transistor being coupled to said compute enable line, wherein said precharge step is executed with a precharge enable signal applied to said precharge enable line, and said compute step is executed with a compute step enable signal applied to said compute enable line.

10. A method of calculating the absolute difference between two analog signals, said method comprising the steps of:

executing a precharge stage, said executing step including the steps of applying a first analog signal to the gate of a first transistor, the source of said first transistor being coupled to a first capacitor that receives a first charge corresponding to said first analog signal, the drain of said first transistor being coupled to a common integration line, and applying a second analog signal to the gate of a second transistor, the source of said second transistor being coupled to a second capacitor that receives a second charge corresponding to said second analog signal, the drain of said second transistor being coupled to said common integration line; and performing a compute stage, said performing step including the steps of:

applying said first analog signal to the gate of said second transistor to generate a second difference analog signal on said second capacitor corresponding to the difference between said first charge and said second charge, applying said second analog signal to the gate of said first transistor to generate a first difference analog signal on said first capacitor corresponding to the difference between said second charge and said first charge, and applying the larger of said first difference analog signal and said second difference analog signal to said common integration line as an absolute difference signal.

11. The method of claim 10 further comprising the step of connecting a node of said first capacitor and a node of said second capacitor to ground.

* * * * *